United States Patent
Chang

(10) Patent No.: US 12,273,128 B2
(45) Date of Patent: Apr. 8, 2025

(54) DELTA-SIGMA MODULATOR

(71) Applicant: REALTEK SEMICONDUCTOR CORP., Hsinchu (TW)

(72) Inventor: Chia-Ling Chang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 147 days.

(21) Appl. No.: 18/185,026

(22) Filed: Mar. 16, 2023

(65) Prior Publication Data
US 2023/0299787 A1 Sep. 21, 2023

(30) Foreign Application Priority Data
Mar. 17, 2022 (TW) .................................. 111109750

(51) Int. Cl.
*H03M 3/00* (2006.01)
(52) U.S. Cl.
CPC ............. *H03M 3/47* (2013.01); *H03M 3/454* (2013.01); *H03M 3/458* (2013.01); *H03M 3/462* (2013.01)
(58) Field of Classification Search
CPC ........ H03M 3/47; H03M 3/454; H03M 3/462; H03M 3/458
USPC .................................................. 341/143, 155
See application file for complete search history.

(56) References Cited

U.S. PATENT DOCUMENTS

| | | | | |
|---|---|---|---|---|
| 5,627,536 A * | 5/1997 | Ramirez | ............... | H03M 3/474 341/143 |
| 7,760,118 B2 * | 7/2010 | Rzehak | ................. | H03M 3/474 341/143 |
| 9,680,496 B2 * | 6/2017 | Kauffman | ............... | H03M 1/46 |
| 10,355,709 B1 * | 7/2019 | Sharma | ................. | H03M 3/472 |
| 10,693,490 B1 * | 6/2020 | Chen | ..................... | H03M 3/458 |
| 10,938,407 B2 * | 3/2021 | Albinet | .................. | G10L 25/78 |
| 2005/0225469 A1 | 10/2005 | White | | |

OTHER PUBLICATIONS

Jesus Arias, et al., "Nonlinearity correction for multibit ΔΣZ DACs" IEEE Transactions on Circuits and 1 Systems—I: Regular Papers, vol. 52, No. 6, Jun. 2005.

* cited by examiner

*Primary Examiner* — Khai M Nguyen
(74) *Attorney, Agent, or Firm* — Li & Cai Intellectual Property (USA) Office

(57) ABSTRACT

A delta-sigma modulator is provided. The delta-sigma modulator includes a multiplexer, a modulation circuit and a demultiplexer. The multiplexer is configured to receive a first analog signal and a second analog signal, and output an input signal. The first analog signal and the second analog signal are in different electrical forms, and the multiplexer is configured to select, in a time-division manner, the first analog signal or the second analog signal as the input signal SIN to be output. The modulation circuit is configured to modulate the input signal into a digital signal. The demultiplexer has a first output terminal and a second output terminal, and selects the first output terminal or the second output terminal in a time-division manner to output the digital signal.

14 Claims, 5 Drawing Sheets

DELTA-SIGMA MODULATOR

CROSS-REFERENCE TO RELATED PATENT APPLICATION

This application claims the benefit of priority to Taiwan Patent Application No. 111109750, filed on Mar. 17, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a delta-sigma modulator, and more particularly to a delta-sigma modulator capable of processing analog signals in different electrical forms.

BACKGROUND OF THE DISCLOSURE

A delta-sigma modulator is often used to achieve high-resolution analog-to-digital conversion, but there is currently no delta-sigma modulator that can process analog signals of different electrical forms, such as direct current (DC) signals and alternating current signals (AC).

SUMMARY OF THE DISCLOSURE

In response to the above-referenced technical inadequacies, the present disclosure provides a delta-sigma modulator capable of processing analog signals in different electrical forms.

In one aspect, the present disclosure provides a delta-sigma modulator that includes a multiplexer, a modulation circuit and a demultiplexer. The multiplexer is configured to receive a first analog signal and a second analog signal, and output an input signal. The first analog signal and the second analog signal are in different electrical forms, and the multiplexer is configured to select, in a time-division manner, the first analog signal or the second analog signal as the input signal to be output. The modulation circuit is coupled to the multiplexer, and is configured to modulate the input signal into a digital signal. The demultiplexer is coupled to the output of the modulation circuit, has a first output terminal and a second output terminal, and is configured to receive the digital signal and select the first output terminal or the second output terminal in the time-division manner, so as to output the digital signal.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
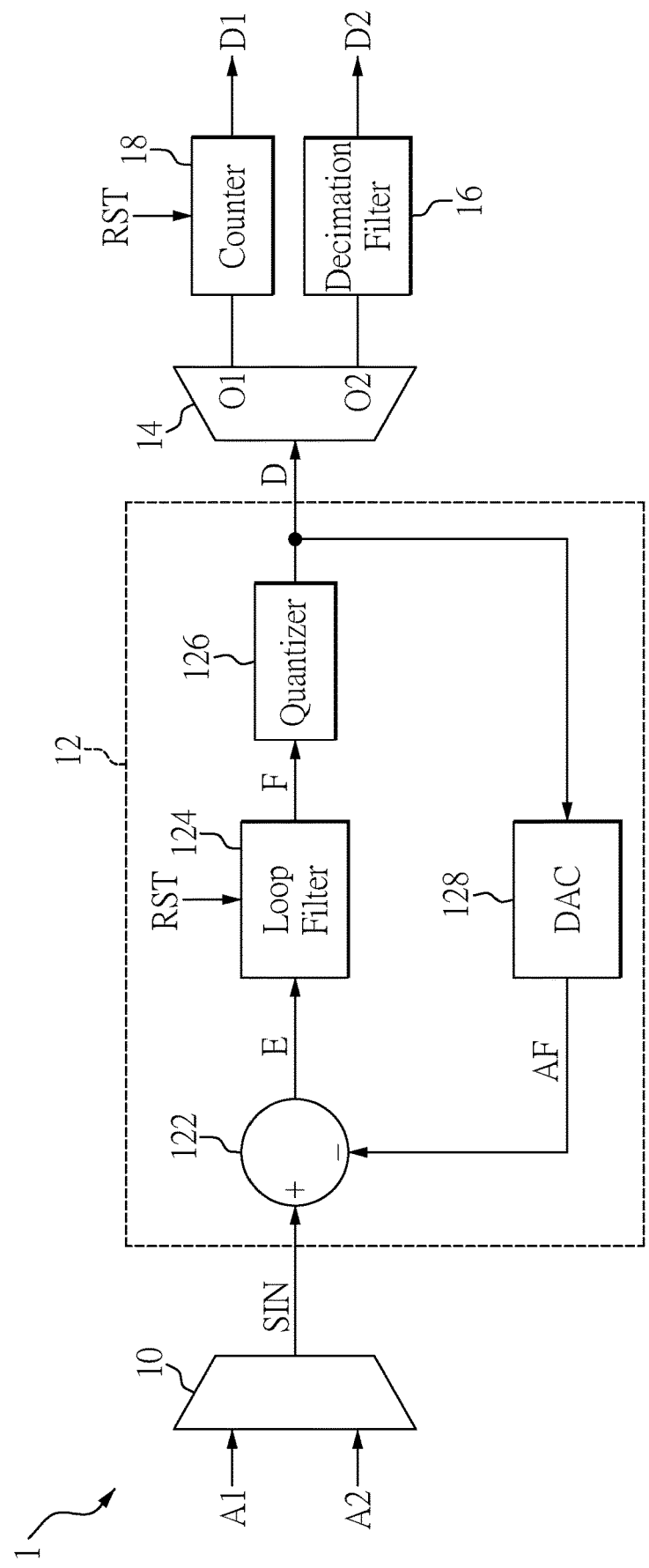
FIG. 1 is a functional block diagram of a delta-sigma modulator according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a functional block diagram of a delta-sigma modulator according to one embodiment of the present disclosure. As shown in FIG. 1, the delta-sigma modulator 1 includes a multiplexer 10, a modulation circuit 12 and a demultiplexer 14. The multiplexer 10 is configured to receive the first analog signal A1 and the second analog signal A2, and to output the input signal SIN. The first analog signal A1 and the second analog signal A2 are in different electrical forms, and the multiplexer 10 is configured to select, in a time-division manner, the first analog signal A1 or the second analog signal A2 as the input signal SIN to be output. In other words, a signal processing time of the delta-sigma modulator 1 can be divided into a plurality of time intervals, and the multiplexer 10 selects the first analog signal A1 or the second analog signal A2 as the input signal SIN of the modulation circuit 12 in each time interval. However, in the present disclosure, lengths of the time intervals are not limited to being the same, and the present disclosure does not limit specific implementations of the multiplexer 10 selecting the first analog signal A1 or the second analog signal A2 as the input signal SIN of the modulation circuit 12, as long as the multiplexer 10 can select the input signal SIN among the first analog signal A1 and the second analog signal A2 to be output.

The modulation circuit 12 is coupled to the multiplexer 10, and is configured to modulate the input signal SIN into the digital signal D. The modulation circuit 12 will be described in more detail in other parts of the disclosure, and will not be further portrayed herein. It should be understood that, regardless of whether the input signal SIN is the first analog signal A1 or the second analog signal A2, the modulation circuit 12 can modulate it to generate the corresponding digital signal D. In addition, the demultiplexer 14 is coupled to the modulation circuit 12 and has a first output terminal O1 and a second output terminal O2. The demultiplexer 14 is configured to receive the digital signal D, and to select the first output terminal O1 or the second output terminal O2 in a time-division manner to output the digital signal D. In the present disclosure, a specific implementation for the demultiplexer 14 to select the first output terminal O1 or the second output terminal O2 to output the digital signal D is not limited, as long as the demultiplexer 14 selects the first output terminal O1 to output the digital signal D in response to the modulation circuit 12 modulating the first analog signal A1 as the input signal SIN to output the corresponding digital signal D, and as long as the demultiplexer 14 selects the second output terminal O2 to output the digital signal D in response to the modulation circuit 12 modulating the second analog signal A2 as the input signal SIN to output the corresponding digital signal D.

Specifically, the modulation circuit 12 includes an operation circuit 122, a loop filter 124, a quantizer 126 and a digital-to-analog converter (DAC) 128. The operation circuit 122 is configured to receive the input signal SIN and an analog feedback signal AF, and calculate a difference between the input signal SIN and the analog feedback signal AF to output a difference signal E. The loop filter 124 is coupled to the operation circuit 122, and is configured to process the difference signal E to generate a filtered signal F. For example, if the input signal SIN and the analog feedback signal AF are DC voltages of 0.2 volts and 1 volt, respectively, the difference signal E can be calculated by subtracting 1 volt from 0.2 volts, which is a DC voltage of −0.8 volts, and the difference signal E is then processed into the filtered signal F by the loop filter 124. Details of the loop filter 124 will be described in other paragraphs, and thus will not be emphasized here.

The quantizer 126 is coupled to the loop filter 124, and is configured to quantize the filtered signal F into the digital signal D. The term "quantize" refers to a process of approximating continuous values of the filtered signal F into a plurality of discrete values, and the quantizer 126 can be implemented by a multi-level comparator, but the present disclosure does not limit the specific implementation of the quantizer 126. In addition, the DAC 128 is coupled to the quantizer 126 and the operation circuit 122, and is configured to perform a digital-to-analog conversion on the digital signal D to generate an analog feedback signal AF. Since an operation principle of the DAC 128 is known to those skilled in the art, details thereof will not be repeated hereinafter. It should be noted that the first analog signal A1 can be a DC signal, and the second analog signal A2 can be an AC signal. For example, the DC signal can be a DC voltage output by a temperature sensor, a gravity sensor or a triaxial sensor, and the AC signal can be an audio signal output by a microphone or an audio device, but the present disclosure is not limited thereto. In other embodiments, the first analog signal A1 can also be an analog signal that is nearly a DC signal, but the present disclosure is not limited thereto.

However, to avoid issues relating to periodic tone when the DC signal (i.e., the first analog signal A1) is too small, the loop filter 124 of the modulation circuit 12 can utilize a periodic reset mechanism to prevent an occurrence thereof. In other words, when the modulation circuit 12 modulates the first analog signal A1 that is used as the input signal SIN, the loop filter 124 is further reset according to a reset signal RST. For example, when the reset signal RST with a high level is received, the loop filter 124 is reset, but the present disclosure does not limit the specific implementation of generating the reset signal RST. Conceptually, delta-sigma modulation is an oversampling technique that can reduce noise in an operating frequency band. Therefore, in this embodiment, an oversampling rate can also be used as a period where the reset signal RST transitions from a low level to the high level.

Further, in order to convert the digital signal D obtained by modulating the AC signal (i.e., the second analog signal A2) into a higher-resolution digital signal, the delta-sigma modulator 1 can further include a decimation filter 16. The decimation filter 16 is coupled to the second output terminal O2 of the demultiplexer 14, and is configured to extract the digital signal D output from the second output terminal O2 to generate a second output signal D2. The decimation filter is used to reduce a sampling frequency of a signal and achieve low-pass filtering. In addition, the decimation filter 16 of this embodiment can not only reduce the sampling frequency of the digital signal D output by the second output terminal O2, but also filter out high-frequency noise to generate the second output signal D2 with a higher resolution.

On the other hand, in addition to the decimation filter 16, the conceptually simplest decimation structure is a counter. Therefore, in order to convert the digital signal D obtained by modulating the DC signal (i.e., the first analog signal A1) into the higher-resolution digital signal, the delta-sigma modulator 1 can further include a counter 18. The counter 18 is coupled to the first output terminal O1 of the demultiplexer 14, and is configured to count the digital signal D output by the first output terminal O1 to generate the first output signal D1 Similarly, the counter 18 can also utilize the periodic reset mechanism to avoid the periodic tone issue. For example, the counter 18 can be reset to zero at the beginning of each predetermined period according to the reset signal RST, and the number of pulses occurring in the predetermined period can be added up. Since an operation principle of the counter 18 is known to those skilled in the art, details thereof will not be repeated hereinafter.

Furthermore, the loop filter 124 can at least include a continuous-time integrator 1242 or a discrete-time integrator 1244, which is configured to integrate the difference signal E, and the filtered signal F is determined by an integration result output by the continuous-time integrator 1242 or the discrete time integrator 1244. Since the operation principle of generating the filtering signal F according to the integration result of the integrator is known to those skilled in the art, the details thereof will not be repeated hereinafter.

Various implementations of the continuous-time integrator 1242 or the discrete-time integrator 1244 are illustrated below with reference to FIGS. 2 to 6.

Figure 2:
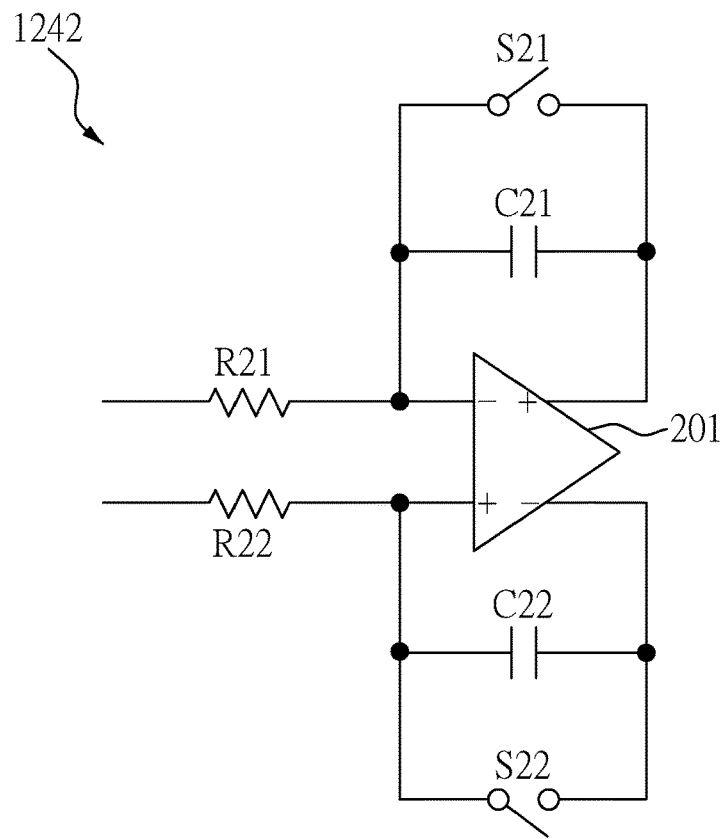
FIG. 2 is a schematic circuit diagram of a continuous-time integrator according to a first embodiment of the present disclosure.

Reference is made to FIG. 2, where FIG. 2 is a schematic circuit diagram of a continuous-time integrator according to a first embodiment of the present disclosure. In the first embodiment, the continuous-time integrator 1242 can include the differential amplifier 201, a resistor R21, a resistor R22, a capacitor C21, and a capacitor C22. The resistor R21 is coupled between the operation circuit 122 (not shown in FIG. 2) and an inverting input terminal of the differential amplifier 201, and the resistor R22 is coupled between the operation circuit 122 and a non-inverting input terminal of the differential amplifier 201. In addition, the capacitor C21 is coupled between the inverting input terminal and a non-inverting output terminal of the differential amplifier 201, and the capacitor C22 is coupled between the non-inverting input terminal and an inverting output terminal of the differential amplifier 201. Therefore, the continuous-time integrator 1242 can be configured to integrate the difference signal E output by the operation circuit 122. However, since operation principles of the differential amplifier 201, the resistor R21, the resistor R22, the capacitor C21 and the capacitor C22 are known to those skilled in the art, details associated with the integration of the difference signal E performed by the continuous-time integrator 1242 will be omitted hereinafter.

As mentioned above, the loop filter 124 is further reset according to the reset signal RST to avoid the periodic tone issue of the DC signal. Therefore, the continuous-time integrator 1242 in the first embodiment can further include a reset switch S21 and a reset switch S22. The reset switch S21 and the capacitor C21 are connected in parallel between the inverting input terminal and the non-inverting output terminal of the differential amplifier 201, and the reset switch S22 and the capacitor C22 are connected in parallel between the non-inverting input terminal and the inverting output terminal of the differential amplifier 201. In addition, the reset signal RST is used to control the reset switch S21 and the reset switch S22. For example, when the reset signal RST with a high level is received, the reset switch S21 and the reset switch S22 are turned on, such that the loop filter 124 is reset to an initial state.

Figure 3:
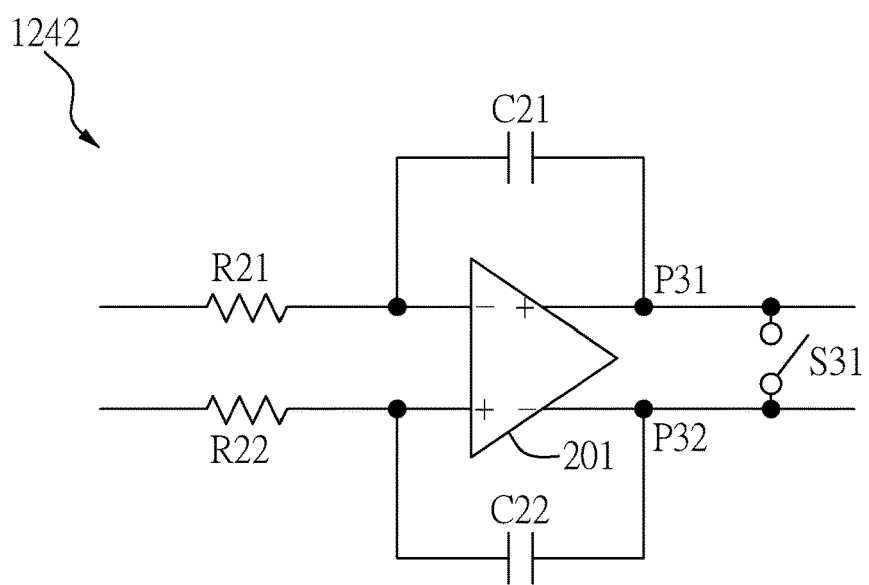
FIG. 3 is a schematic circuit diagram of a continuous-time integrator according to a second embodiment of the present disclosure.

Reference is made to FIG. 3, which is a schematic circuit diagram of a continuous-time integrator according to a second embodiment of the present disclosure. Since the continuous-time integrator 1242 of the second embodiment is similar to the continuous-time integrator 1242 of the first embodiment, similarities between the two embodiments will not be repeated. It should be noted that, different from the reset switch S21 and the reset switch S22 of the first embodiment, the continuous-time integrator 1242 of the second embodiment includes a reset switch S31. As shown in FIG. 3, the first terminal of the capacitor C21 is coupled to the non-inverting output terminal of the differential amplifier 201 through a node P31, and the first terminal of the capacitor C22 is coupled to the inverting output terminal of the differential amplifier 201 through a node P32. In addition, the reset switch S31 is coupled between the node P31 and the node P32, and the reset signal RST is used to control the reset switch S31. For example, when the reset signal RST with a high level is received, the reset switch S31 is turned on to reset the loop filter 124.

Figure 4:
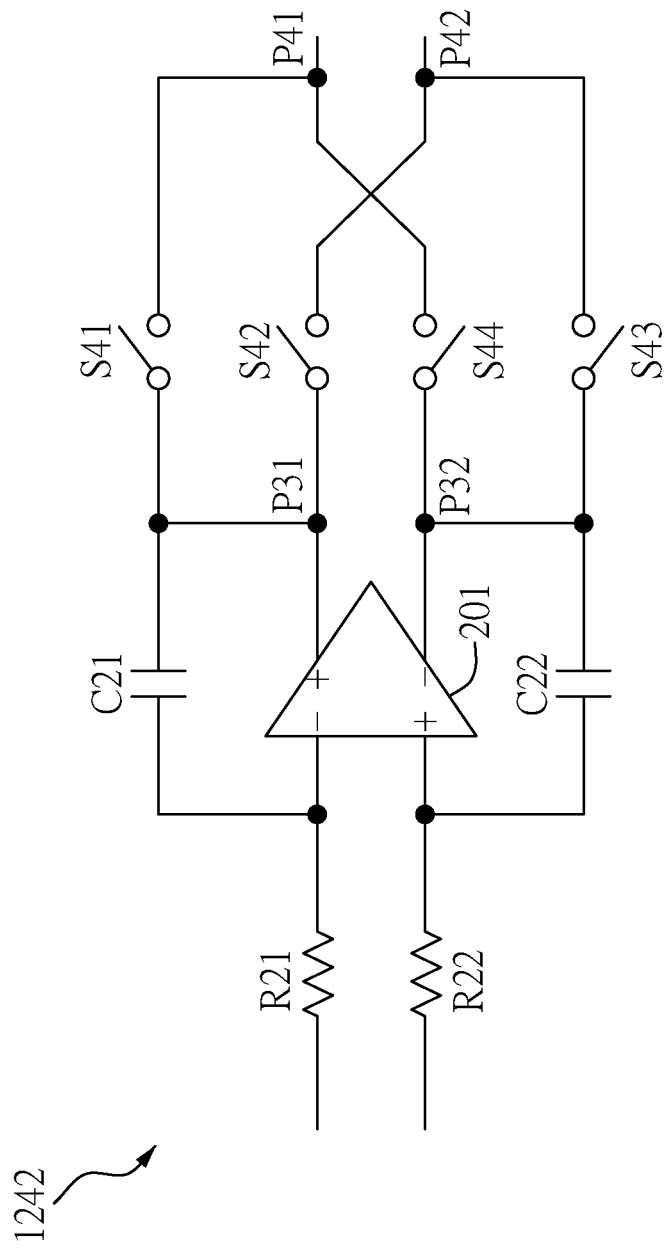
FIG. 4 is a schematic circuit diagram of a continuous-time integrator according to a third embodiment of the present disclosure.

Reference is made to FIG. 4, which is a schematic circuit diagram of a continuous-time integrator according to a third embodiment of the present disclosure. Since the continuous-time integrator 1242 of the third embodiment is similar to the continuous-time integrator 1242 of the second embodiment, similarities between the two embodiments will not be repeated. It should be noted that, different from the reset switch S31 of the second embodiment, the continuous-time integrator 1242 in the third embodiment further includes a setting switch S41, a reset switch S42, a setting switch S43 and a reset switch S44. The setting switch S41 is coupled between a node P31 and a node P41, and an inverted reset signal RST* (not shown in FIG. 4) is used to control the setting switch S41. The reset switch S42 is coupled between the node P31 and a node P42, and the reset signal RST is used to control the reset switch S42. On the other hand, the setting switch S43 is coupled between a node P32 and the node P42, and the inverted reset signal RST* is used to control the setting switch S43. The reset switch S44 is coupled between the node P32 and the node P41, and the reset signal RST is used to control the reset switch S44. When the loop filter 124 is not reset, the setting switch S41 and the setting switch S43 are turned on, such that the setting switch S41 is controlled to couple the node P41 to the node P31, and the setting switch S43 is controlled to couple the node P42 to the node P32. When the loop filter 124 is reset, the reset switch S42 and the reset switch S44 are turned on, such that the reset switch S42 is controlled to couple the node P42 to the node P31, and the reset switch S44 is controlled to couple the node P41 to the node P32.

Figure 5:
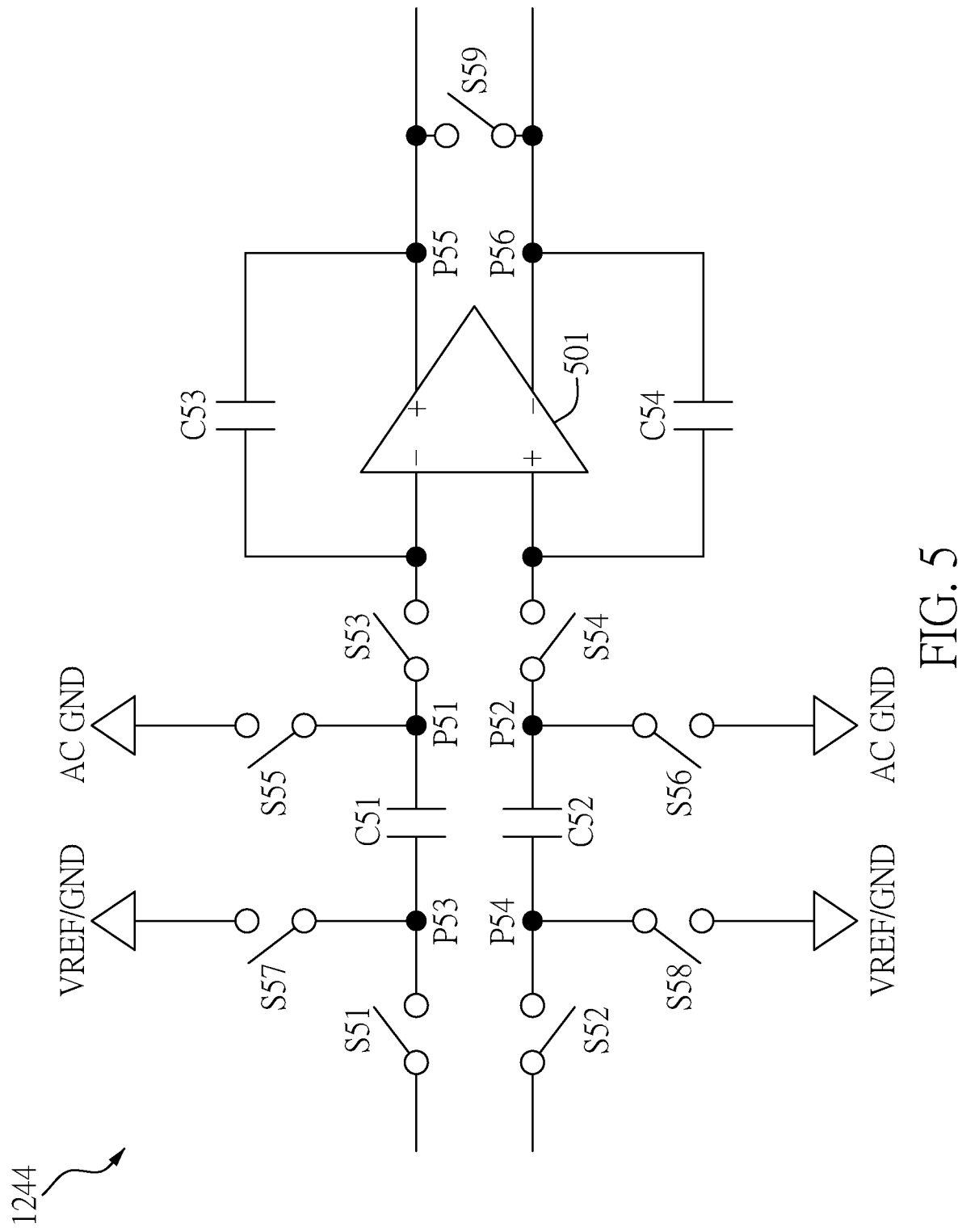
FIG. 5 is a schematic circuit diagram of a discrete-time integrator according to the first embodiment of the present disclosure.

Furthermore, reference is made to FIG. 5, which is a schematic circuit diagram of a discrete-time integrator according to the first embodiment of the present disclosure. In the first embodiment, the discrete-time integrator 1244 can include a differential amplifier 501, capacitors C51 to C54, and switches S51 to S58. The capacitor C51 is coupled between the operation circuit 122 (not shown in FIG. 5) and an inverting input terminal of the differential amplifier 501, and the capacitor C52 is coupled between the operation circuit 122 and a non-inverting input terminal of the differential amplifier 501. In addition, the capacitor C53 is coupled between the inverting input terminal and a non-inverting output terminal of the differential amplifier 501, and the capacitor C54 is coupled between the non-inverting input terminal and an inverting output terminal of the differential amplifier 501.

The switch S51 is coupled between the capacitor C51 and the operation circuit 122, and the switch S52 is coupled between the capacitor C52 and the operation circuit 122. In addition, the switch S53 is coupled between the capacitor C51 and the inverting input terminal of the differential amplifier 501, and the switch S54 is coupled between the capacitor C52 and the non-inverting input terminal of the differential amplifier 501. The switch S55 is coupled between an AC ground voltage GND (AC GND) and a relay node P51, and the relay node P51 is connected between the capacitor C51 and the switch S53. The switch S56 is coupled between the AC ground voltage GND (AC GND) and a relay node P52, and the relay node P52 is between the capacitor C52 and the switch S54. In addition, the switch S57 is coupled between a first voltage and a relay node P53, the first voltage can be a reference voltage or a ground voltage (VREF/GND), and the relay node P53 is between the switch S51 and the capacitor C51. The switch S58 is coupled between a second voltage and a relay node P54, the second voltage can be the reference voltage or the ground voltage (VREF/GND), and the relay node P54 is connected between the switch S52 and the capacitor C52. In operation, the switch S51, the switch S55, the switch S52, and the switch S56 are turned on in a first time interval, and the switch S53, the switch S57, the switch S54, and the switch S58 are turned on in a second time interval different from the first time interval. Since operation principles of the differential amplifier 501, the capacitors C51 to C54, and the switches S51 to S58 are known to those skilled in the art, details associated with the integration of the difference signal E performed by the discrete-time integrator 1244 will be omitted hereinafter.

As mentioned above, the loop filter 124 is further reset according to the reset signal RST to avoid the periodic tone issue of the DC signal. Therefore, the discrete-time integrator 1244 of the first embodiment can further include a reset switch S59. As shown in FIG. 5, a first terminal of the capacitor C53 is coupled to the non-inverting output terminal of the differential amplifier 501 through a node P55, and a first terminal of the capacitor C54 is coupled to the inverting output terminal of the differential amplifier 501 through a node P56. In addition, the reset switch S59 is coupled between the node P55 and the node P56, and the reset signal RST is used to control the reset switch S59. For example, when the reset signal RST with a high level is received, the reset switch S59 is turned on to reset the loop filter 124.

Figure 6:
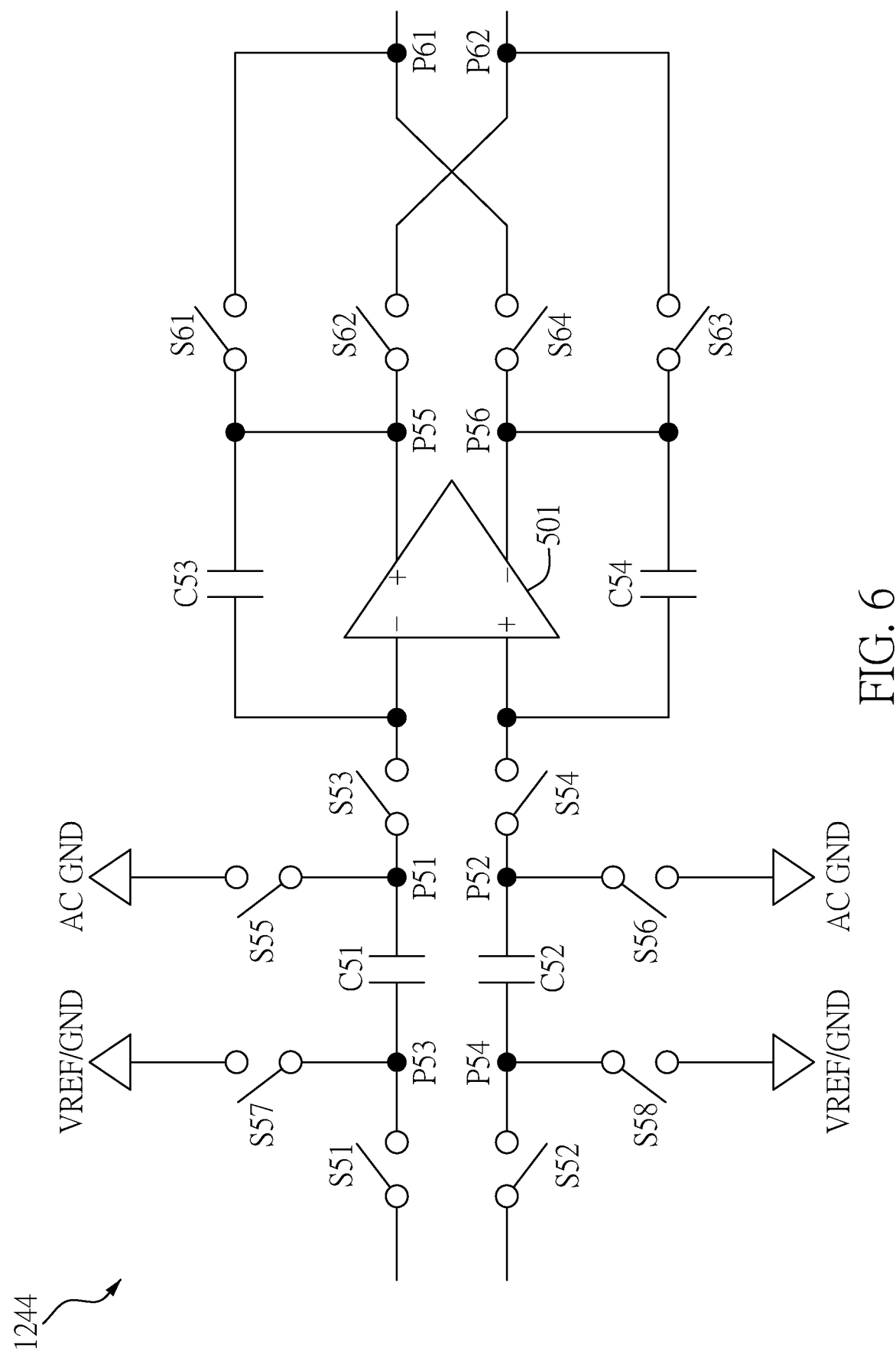
FIG. 6 is a schematic circuit diagram of a discrete-time integrator according to the second embodiment of the present disclosure.

Reference is made to FIG. 6, which is a schematic circuit diagram of a discrete-time integrator according to a second embodiment of the present disclosure. Since the discrete-time integrator 1244 of the second embodiment is similar to the discrete-time integrator 1244 of the first embodiment, similarities between the two embodiments will not be repeated. It should be noted that, different from the reset switch S59 of the first embodiment, the discrete-time integrator 1244 of the second embodiment includes a setting switch S61, a reset switch S62, a setting switch S63 and a reset switch S64. The setting switch S61 is coupled between a node P55 and a node P61, and an inverted reset signal RST* (not shown in FIG. 6) is used to control the setting switch S61. The reset switch S62 is coupled between the node P55 and a node P62, and the reset signal RST is used to control the reset switch S62. On the other hand, the setting switch S63 is coupled between a node P56 and the node P62, and the inverted reset signal RST* is used to control the setting switch S63. The reset switch S64 is coupled between a node P56 and the node P61, and the reset signal RST is used to control the reset switch S64. When the loop filter 124 is not reset, the setting switch S61 and the setting switch S63 are turned on, such that the setting switch S61 is controlled to couple the node P61 to the node P55, and the setting switch S63 is controlled to couple the node P62 to the node P56. When the loop filter 124 is reset, the reset switch S62 and the reset switch S64 are turned on, such that the reset switch S62 is controlled to couple the node P62 to the node P55, and the reset switch S64 is controlled to couple the node P61 to the node P56.

In conclusion, in the delta-sigma modulator provided by the present disclosure, analog signals in different electrical forms can be processed through the multiplexer, the modulation circuit and the demultiplexer. In addition, the loop filter of the modulation circuit can avoid the periodic tone issue by utilizing the periodic reset mechanism.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A delta-sigma modulator, comprising:
    a multiplexer configured to receive a first analog signal and a second analog signal, and output an input signal, wherein the first analog signal and the second analog signal are in different electrical forms, and the multiplexer is configured to select, in a time-division manner, the first analog signal or the second analog signal as the input signal to be output;
    a modulation circuit coupled to the multiplexer, wherein the modulation circuit is configured to modulate the input signal into a digital signal; and
    a demultiplexer coupled to the modulation circuit, wherein the demultiplexer has a first output terminal and a second output terminal, and is configured to receive the digital signal and select the first output terminal or the second output terminal in the time-division manner, so as to output the digital signal;
    wherein, in response to the input signal being a direct current signal, a loop filter of the modulation circuit is reset according to a reset signal with a high level, and an oversampling rate is used as a period where the reset signal changes from a low level to the high level.

2. The delta-sigma modulator according to claim 1, wherein the modulation circuit includes:
    an operation circuit configured to receive the input signal and an analog feedback signal, and calculate a difference between the input signal and the analog feedback signal to output a difference signal;
    the loop filter coupled to the operation circuit, wherein the loop filter is configured to process the difference signal to generate a filtered signal;
    a quantizer coupled to the loop filter, wherein the quantizer is configured to quantize the filtered signal into the digital signal; and
    a digital-to-analog converter (DAC) coupled to the quantizer and the operation circuit, wherein the DAC is configured to perform a digital-to-analog conversion on the digital signal to generate the analog feedback signal.

3. The delta-sigma modulator according to claim 2, wherein the first analog signal is the direct current (DC) signal, and the second analog signal is an alternating current (AC) signal.

4. The delta-sigma modulator according to claim 1, further comprising:
    a counter coupled to the first output terminal of the demultiplexer, wherein the counter is configured to count the digital signal outputted by the first output terminal, so as to generate a first output signal; and
    a decimation filter coupled to the second output terminal of the demultiplexer, wherein the decimation filter is configured to extract the digital signal outputted from the second output terminal to generate a second output signal.

5. The delta-sigma modulator according to claim 4, wherein the counter is reset to zero according to the reset signal.

6. The delta-sigma modulator according to claim 1, wherein the loop filter includes a continuous-time integrator or a discrete-time integrator for integrating the difference signal, and the filtered signal is determined by an integration result outputted by the continuous-time integrator or the discrete time integrator.

7. The delta-sigma modulator according to claim 6, wherein the continuous-time integrator includes:
   a differential amplifier;
   a first resistor coupled between the operation circuit and an inverting input terminal of the differential amplifier;
   a second resistor coupled between the operation circuit and a non-inverting input terminal of the differential amplifier;
   a first capacitor coupled between the inverting input terminal and a non-inverting output terminal of the differential amplifier; and
   a second capacitor coupled between the non-inverting input terminal and an inverting output terminal of the differential amplifier.

8. The delta-sigma modulator according to claim 7, wherein the continuous-time integrator further includes:
   a first reset switch connected in parallel with the first capacitor between the inverting input terminal and the non-inverting output terminal of the differential amplifier; and
   a second reset switch connected in parallel with the second capacitor between the non-inverting input terminal and the inverting output terminal of the differential amplifier;
   wherein the reset signal is used to control the first reset switch and the second reset switch.

9. The delta-sigma modulator according to claim 7, wherein the continuous-time integrator further includes:
   a first reset switch coupled between a first node and a second node, the reset signal being used to control the first reset switch, wherein a first terminal of the first capacitor is coupled to the non-inverting output terminal of the differential amplifier through the first node, and a first terminal of the second capacitor is coupled to the inverting output terminal of the differential amplifier through the second node.

10. The delta-sigma modulator according to claim 7, wherein a first terminal of the first capacitor is coupled to the non-inverting output terminal of the differential amplifier through a first node, and a first terminal of the second capacitor is coupled to the inverting output terminal of the differential amplifier through a second node, and the continuous-time integrator further includes:
    a first setting switch coupled between the first node and a third node, wherein the reset signal being inverted is used to control the first setting switch, and when the loop filter is not reset, the first setting switch is controlled to couple the third node to the first node;
    a first reset switch coupled between the first node and a fourth node, the reset signal being used to control the first reset switch, wherein, when the loop filter is reset, the first reset switch is controlled to couple the fourth node to the first node;
    a second setting switch coupled between the second node and the fourth node, wherein the reset signal being inverted is used to control the second setting switch, and when the loop filter is not reset, the second setting switch is controlled to couple the fourth node to the second node; and
    a second reset switch coupled between the second node and the third node, the reset signal being used to control the second reset switch, wherein, when the loop filter is reset, the second reset switch is controlled to couple the third node to the second node.

11. The delta-sigma modulator according to claim 6, wherein the discrete-time integrator includes:
    a differential amplifier;
    a first capacitor coupled between the operation circuit and an inverting input terminal of the differential amplifier;
    a second capacitor coupled between the operation circuit and a non-inverting input terminal of the differential amplifier;
    a third capacitor coupled between the inverting input terminal and a non-inverting output terminal of the differential amplifier;
    a fourth capacitor coupled between the non-inverting input terminal and an inverting output terminal of the differential amplifier;
    a first switch coupled between the first capacitor and the operation circuit;
    a second switch coupled between the second capacitor and the operation circuit;
    a third switch coupled between the first capacitor and the inverting input of the differential amplifier; and
    a fourth switch coupled between the second capacitor and the non-inverting input terminal of the differential amplifier, wherein the first switch and the second switch are turned on in a first time interval, and the third switch and the fourth switch are turned on in a second time interval different from the first time interval.

12. The delta-sigma modulator according to claim 11, wherein the discrete-time integrator further includes:
    a fifth switch coupled between an AC ground voltage and a first relay node, the first relay node being connected between the first capacitor and the third switch;
    a sixth switch coupled between the AC ground voltage and a second relay node, the second relay node being connected between the second capacitor and the fourth switch;
    a seventh switch coupled between a first voltage and a third relay node, the third relay node being between the first switch and the first capacitor, wherein the first voltage is a reference voltage or a ground voltage; and
    an eighth switch coupled between a second voltage and a fourth relay node, the fourth relay node being connected between the second switch and the second capacitor, wherein the second voltage is the reference voltage or the ground voltage;
    wherein the fifth switch and the sixth switch are turned on in the first time interval, and the seventh switch and the eighth switch are turned on in the second time interval.

13. The delta-sigma modulator according to claim 12, wherein the discrete-time integrator further includes:
    a first reset switch coupled between a first node and a second node, the reset signal being used to control the first reset switch, wherein a first terminal of the third capacitor is coupled to the non-inverting output terminal of the differential amplifier through the first node, and a first terminal of the fourth capacitor is coupled to the inverting output terminal of the differential amplifier through the second node.

14. The delta-sigma modulator according to claim 12, wherein a first terminal of the third capacitor is coupled to the non-inverting output terminal of the differential amplifier through a first node, and a first terminal of the fourth capacitor is coupled to the inverting output terminal of the differential amplifier through a second node, and the discrete-time integrator further includes:
    a first setting switch coupled between the first node and a third node, wherein the reset signal being inverted is used to control the first setting switch, and when the loop filter is not reset, the first setting switch is controlled to couple the third node to the first node;

a first reset switch coupled between the first node and a fourth node, the reset signal being used to control the first reset switch, wherein, when the loop filter is reset, the first reset switch is controlled to couple the fourth node to the first node;

a second setting switch coupled between the second node and the fourth node, wherein the reset signal being inverted is used to control the second setting switch, and when the loop filter is not reset, the second setting switch is controlled to couple the fourth node to the second node; and a second reset switch coupled between the second node and the third node, and the reset signal being used to control the second reset switch, wherein, when the loop filter is reset, the second reset switch is controlled to couple the third node to the second node.

* * * * *